(12) United States Patent
Terai et al.

(10) Patent No.: US 8,847,230 B2
(45) Date of Patent: Sep. 30, 2014

(54) THIN FILM TRANSISTOR AND DISPLAY DEVICE

(71) Applicant: Sony Corporation, Tokyo (JP)

(72) Inventors: Yasuhiro Terai, Kanagawa (JP); Eri Fukumoto, Kanagawa (JP); Toshiaki Arai, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/916,287

(22) Filed: Jun. 12, 2013

(65) Prior Publication Data

US 2013/0270566 A1   Oct. 17, 2013

Related U.S. Application Data

(62) Division of application No. 13/155,118, filed on Jun. 7, 2011, now Pat. No. 8,486,774.

(30) Foreign Application Priority Data

Jun. 17, 2010 (JP) .................................. 2010-138375

(51) Int. Cl.
*H01L 29/786* (2006.01)

(52) U.S. Cl.
USPC .......... 257/59; 257/57; 257/60; 257/E29.003; 257/E33.004

(58) Field of Classification Search
USPC ................. 257/59, 57, 60, E29.003, E33.004
See application file for complete search history.

(56) References Cited

FOREIGN PATENT DOCUMENTS

| JP | 2007-519256 | 7/2007 |
| JP | 2008-85048 | 4/2008 |
| WO | 2005/074038 A1 | 8/2005 |

OTHER PUBLICATIONS

Cetin Kilic et al., In-type doping of oxides by hydrogen, Applied Physics Letters, vol. 81, No. 1, p. 73-75.

*Primary Examiner* — Long Pham
(74) *Attorney, Agent, or Firm* — K&L Gates LLP

(57) ABSTRACT

A thin film transistor is provided that includes a gate electrode, a source electrode, and a drain electrode, an oxide semiconductor active layer formed over the gate electrode, a fixed charge storage layer formed over a portion of the oxide semiconductor active layer, and a fixed charge control electrode formed over the fixed charged storage layer.

18 Claims, 14 Drawing Sheets

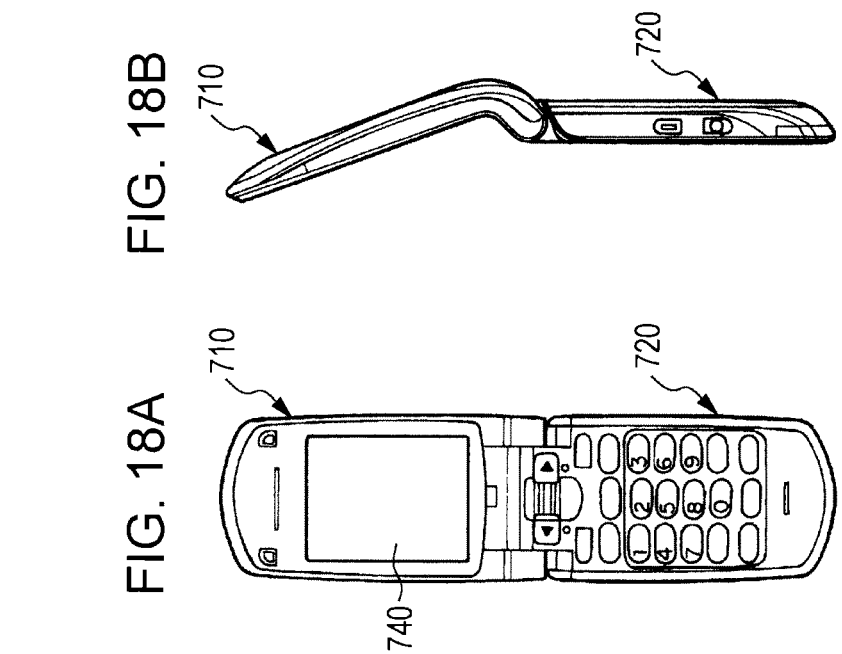
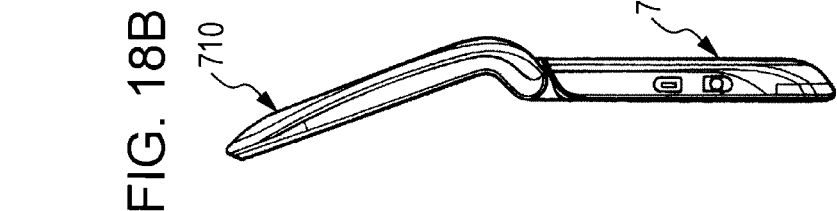
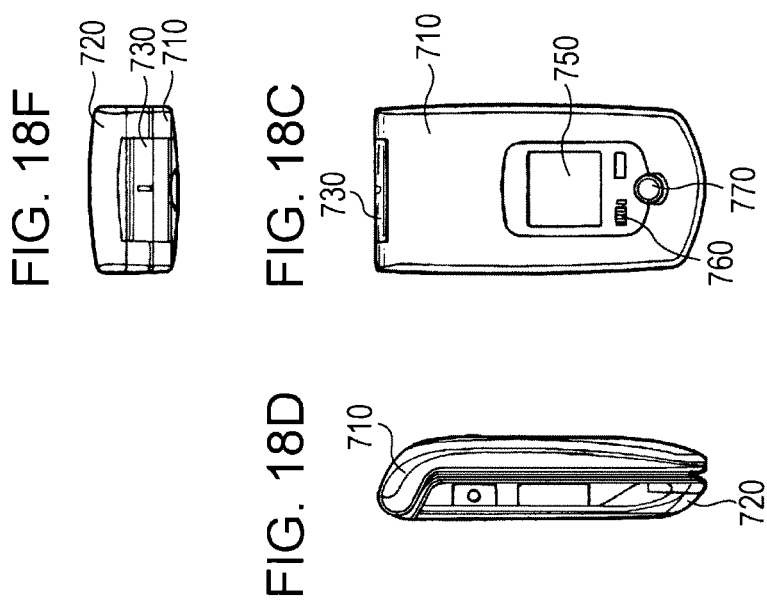
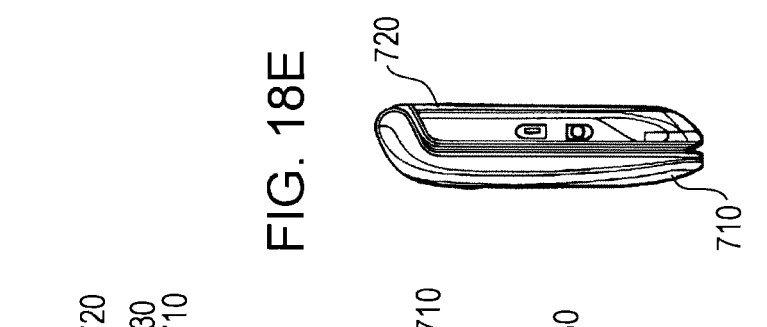
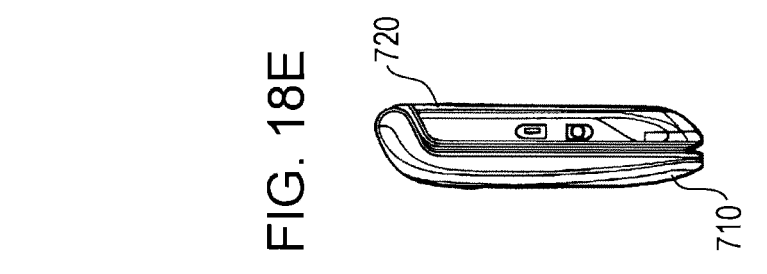
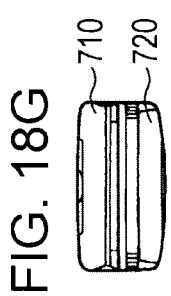
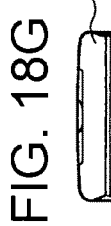

THIN FILM TRANSISTOR AND DISPLAY DEVICE

CROSS REFERENCES TO RELATED APPLICATIONS

The present application is a Divisional Application of U.S. patent application Ser. No. 13/155,118 filed Jun. 7, 2011, which claims priority to that disclosed in Japanese Priority Patent Application JP 2010-138375 filed in the Japan Patent Office on Jun. 17, 2010, the entire contents of which are hereby incorporated by reference.

BACKGROUND

The present disclosure relates to a thin film transistor (TFT) using an oxide semiconductor and a display device including the thin film transistor.

Oxide semiconductors such as zinc oxide and indium gallium zinc oxide (IGZO) have superior characteristics as an active layer of a semiconductor device, and have recently been developed so as to be applied to TFTs, light-emitting devices, transparent electroconductive films, and the like.

For example, oxide semiconductor TFTs have higher electron mobilities than a TFT having an amorphous silicon (a-Si:H) channel that has been used in liquid crystal display devices, and are thus superior in electrical properties. In addition, even a channel formed at a low temperature around room temperature can be expected to have a high mobility.

However, oxide semiconductors do not have sufficient heat resistance. It is known that oxygen atoms, zinc atoms or the like are diffused in the oxide semiconductor to form a lattice defect by heat treatment in a TFT manufacturing process. This lattice defect creates a shallow impurity level to reduce the resistance of the oxide semiconductor layer. In a TFT having an oxide semiconductor active layer, accordingly, a drain current flows even though a gate voltage is not applied (normally-on operation or depletion operation). Thus, the threshold voltage is reduced as the defect level increases, and the leakage current is increased accordingly.

It is reported that hydrogen is an element that can create a shallow impurity level in an oxide semiconductor (for example, Cetin Kilic et al., "n-Type doping of oxides by hydrogen,"Applied Physics Letters, Vol. 81, No. 1, pp. 73-75, Jul. 1, 2002). Accordingly, hydrogen and other elements introduced in TFT manufacturing processes, as well as the lattice defect, are likely to affect the characteristics of oxide semiconductor TFTs. In transistors having oxide semiconductor channels, accordingly, the carrier concentration in the channel tends to increase, and the threshold voltage becomes negative easily.

Since it is difficult to form a P-channel in a TFT having an oxide semiconductor channel, the circuit is constituted of only N-channel transistors. In this instance, if the threshold voltage is negative, the circuit configuration becomes complicated undesirably. In order to solve this problem, it is suggested to control the threshold voltage. The threshold voltage is represented by the following equation:

$$V_{Th} = \phi_{MS} - \frac{Q_f}{C_{OX}} + 2\phi_f + \frac{\sqrt{2\varepsilon_s\varepsilon_0 qN_A 2\phi_f}}{C_{OX}}$$

In the equation, $V_{Th}$ represents the threshold voltage, $\phi_{MS}$ represents the difference in work function between the gate electrode and the oxide semiconductor layer, $Q_f$ represents the fixed charge, $C_{OX}$ represents the capacitance of the gate insulating layer, $\phi_f$ represents the Fermi level of the oxide semiconductor layer acting as a channel, $N_A$ represents the accepter density, $\varepsilon_s$ represents the dielectric constant of the oxide semiconductor layer, and $\varepsilon_0$ represents the dielectric constant of vacuum.

The threshold voltage of a TFT may be varied by doping a portion of the channel at the interface between the channel and the gate insulating layer, or by changing the Fermi level of the oxide semiconductor acting as the channel by varying the proportion of the constituents of the oxide semiconductor (for example, Japanese Unexamined Patent Application Publication (Translation of PCT Application) No. 2007-519256 and Japanese Unexamined Patent Application Publication No. 2008-85048.

SUMMARY

However, doping of the channel may cause a degradation of the TFT performance. In general, an oxide semiconductor active layer is formed of a multi-element material by sputtering. Accordingly, if doping of a channel is performed by sputtering, it is very difficult to control the composition ratio of the active layer because it is made of a multi-element material.

Another approach to vary the threshold voltage may be that a fixed charge ($Q_f$ in the above equation) is applied to the gate insulating layer to cause depletion in the semiconductor channel layer on purpose. Unfortunately, this approach can undesirably damage the gate insulating layer when a fixed charge $Q_f$ is applied.

Accordingly, it is desirable to provide a thin film transistor whose threshold voltage can be shifted to the positive side without applying a fixed charge to the gate insulating layer, and a display device including the thin film transistor.

In one embodiment, a thin film transistor includes: a gate electrode, a source electrode, and a drain electrode; an oxide semiconductor active layer formed over the gate electrode; a fixed charge storage layer formed over a portion of the oxide semiconductor active layer; and a fixed charge control electrode formed over the fixed charged storage layer. In an embodiment, the thin film transistor further comprises a buffer layer formed between the oxide semiconductor active layer and the fixed charge storage layer. In an embodiment, the buffer layer is made of an insulating material and is positioned between the fixed charge storage layer and a channel region of the oxide semiconductor active layer. In an embodiment, the buffer layer is made of silicon oxide, and the fixed charge storage layer includes at least one film selected from the group consisting of a silicon nitride film, an aluminum nitride film and an aluminum oxide film. In an embodiment, the thin film transistor further comprises an insulating interlayer on the source electrode and the drain electrode, the insulating interlayer having an opening opposing the upper surface of the fixed charge storage layer in such a manner that the fixed charge control electrode is disposed on an inner surface of the opening. In an embodiment, the buffer layer has a thickness in the range of 1 to 50 nm. In an embodiment, the fixed charge storage layer has a thickness of 100 nm or less. In an embodiment, the source electrode and the drain electrode are provided on portions of the oxide semiconductor active layer, and also contact both sides of the buffer layer and the fixed charge storage layer. In an embodiment, the buffer layer is formed of an insulating material and is configured to control a discharge of electrons stored in the fixed charge storage layer. In an embodiment, the thin film transistor further includes a protective film formed on surfaces of a gate insulating layer, the source electrode, and the drain electrode, wherein the protective film is formed between the fixed charge storage layer and the fixed charge control electrode, and wherein the gate insulating layer is formed between the gate electrode and the oxide semiconductor active layer. In an embodiment, the thin film transistor further includes an insulating interlayer surrounding portions of the gate insulating layer and the protective film. In an embodiment, the insulating interlayer has an insulating interlayer opening opposing an upper surface of the fixed charge storage layer. In an embodiment, the fixed charge control electrode is disposed at least on a bottom surface and side surfaces of the insulating interlayer opening. In an embodiment, the oxide semiconductor active layer includes a channel region, and the buffer layer and the fixed charge layer are formed of shapes at least substantially corresponding to a shape of the channel region. In an embodiment, a portion of the protective film overlying the channel region has a thickness smaller than other portions of the protective film. In an embodiment, the source electrode and the drain electrode are provided on portions of the oxide semiconductor active layer.

In another embodiment, a method of manufacturing a thin film transistor includes: forming a gate electrode; forming an oxide semiconductor active layer over the gate electrode; forming a fixed charge storage layer over the oxide semiconductor active layer; forming a source electrode and a drain electrode adjacent to the fixed charge storage layer and the oxide semiconductor active layer; and forming a fixed charge control electrode over the fixed charge storage layer. In an embodiment, the method further includes forming a buffer layer between the oxide semiconductor active layer and the fixed charge storage layer. In an embodiment, the buffer layer is made of an insulating material and is positioned between the fixed charge storage layer and a channel region of the oxide semiconductor active layer. In an embodiment, the buffer layer is made of silicon oxide, and the fixed charge storage layer includes at least one film selected from the group consisting of a silicon nitride film, an aluminum nitride film and an aluminum oxide film. In an embodiment, the method further includes forming an insulating interlayer on the source electrode and the drain electrode, the insulating interlayer having an opening opposing the upper surface of the fixed charge storage layer in such a manner that the fixed charge control electrode is disposed on an inner surface of the opening. In an embodiment, the buffer layer has a thickness in the range of 1 to 50 nm. In an embodiment, the fixed charge storage layer has a thickness of 100 nm or less. In an embodiment, the source electrode and the drain electrode are provided on portions of the oxide semiconductor active layer, and also contact both sides of the buffer layer and the fixed charge storage layer. In an embodiment, the buffer layer is formed of an insulating material and is configured to control a discharge of electrons stored in the fixed charge storage layer. In an embodiment, the method further includes forming a protective film on surfaces of a gate insulating layer, the source electrode, and the drain electrode, wherein the protective film is formed between the fixed charge storage layer and the fixed charge control electrode, and wherein the gate insulating layer is formed between the gate electrode and the oxide semiconductor active layer. In an embodiment, the method further includes forming an insulating interlayer to surround portions of the gate insulating layer and the protective film. In an embodiment, the insulating interlayer has an insulating interlayer opening opposing an upper surface of the fixed charge storage layer. In an embodiment, the fixed charge control electrode is disposed at least on a bottom surface and side surfaces of the insulating interlayer opening.

In an embodiment, the oxide semiconductor active layer includes a channel region, and the buffer layer and the fixed charge layer are formed of shapes at least substantially corresponding to a shape of the channel region. In an embodiment, a portion of the protective film overlying the channel region has a thickness smaller than other portions of the protective film. In an embodiment, the source electrode and the drain electrode are provided on portions of the oxide semiconductor active layer.

In another embodiment, a method of increasing the threshold voltage of a thin film transistor includes: applying a positive potential to a fixed charge control electrode; applying a negative potential to a drain electrode; and injecting electrons to a fixed charge storage layer and storing the electrons in the fixed charge storage layer, the electrons having been accelerated by a channel electric field or produced by impact ionization from a channel region of an oxide semiconductor active layer that is located near the drain electrode. In an embodiment, the method further includes either applying a negative potential to a source electrode, or enabling the source electrode to be in a floating state. In an embodiment, the method further includes providing a buffer layer between the fixed charge storage layer and the oxide semiconductor active layer to inhibit a discharge of a fixed charge stored in the fixed charge storage layer. In an embodiment, the fixed charge storage layer is made of an insulating material.

In another embodiment, a display device includes: a substrate; a thin film transistor formed on the substrate, the thin film transistor including a gate electrode, a gate insulating layer disposed on the surface of the gate electrode, an oxide semiconductor layer including a channel region on the gate insulating layer, a fixed charge storage layer having an upper surface, made of an insulating material over the channel region, a source electrode and a drain electrode that are each electrically connected to the oxide semiconductor layer, and a fixed charge control electrode disposed at the upper surface side of the fixed charge storage layer; and a pixel formed on the substrate. In an embodiment, the pixel is an organic luminescent element including a lower electrode, an organic layer including a luminescent layer, and an upper electrode, in that order from the substrate side, and the fixed charge storage layer is made of the same material as the lower electrode or the upper electrode.

In the thin film transistor or the display device of the embodiments, since the fixed charge storage layer made of an insulating material is disposed over the channel region, and the fixed charge control electrode is disposed at the upper surface side of the fixed charge storage layer, the threshold voltage can be shifted to the positive side without degrading the gate insulating layer.

Additional features and advantages are described herein, and will be apparent from the following Detailed Description and the figures.

BRIEF DESCRIPTION OF THE FIGURES

FIGS. 18A to 18G are views of the exterior of a cellular phone according to Application 6: FIG. 18A is a front view in an open state; FIG. 18B is a side view; FIG. 18C is a front view in a closed state; FIG. 18D is a left side view; FIG. 18E is a right side view; FIG. 18F is a top view; and FIG. 18G is a bottom view.

DETAILED DESCRIPTION

Figure 1:
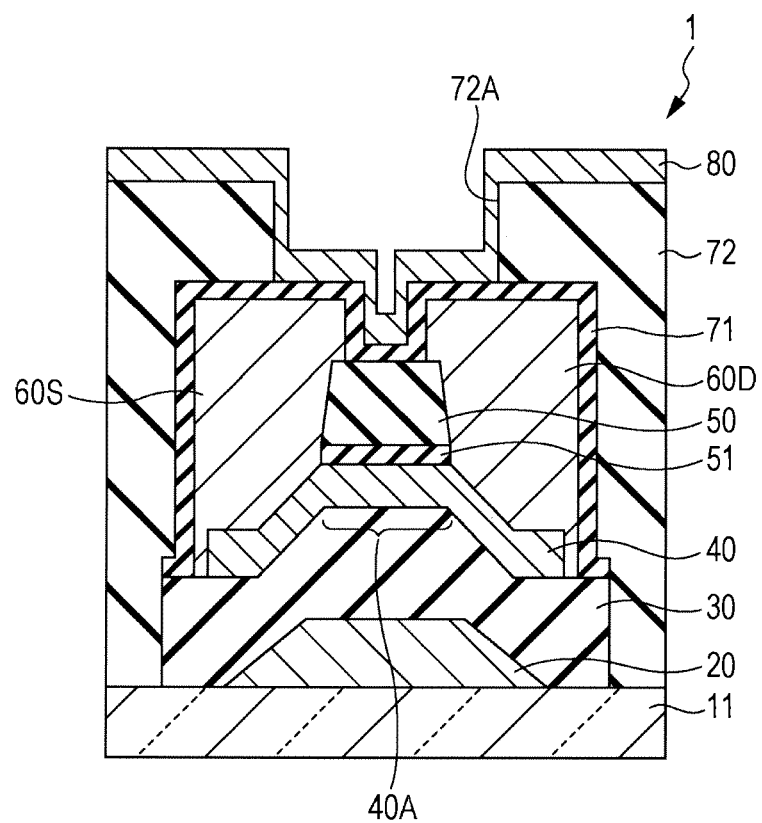
FIG. 1 is a sectional view of a thin film transistor according to an embodiment.

Embodiments will be now described in detail with reference to the drawings. The description will be made in the following order:

1. Embodiment including an oxide semiconductor layer entirely disposed on a gate insulating layer
2. Modification in which only the channel region of the oxide semiconductor layer is disposed on a gate insulating layer
3. Applications FIG. 1 shows the sectional structure of a thin film transistor 1 according to an embodiment. The thin film transistor 1 is used as a driving element of liquid crystal display devices and organic electroluminescence (EL) displays, and may have a bottom gate structure (inversed staggered structure) that includes a gate electrode 20, a gate insulating layer 30, an oxide semiconductor layer 40, a buffer layer 51, a fixed charge storage layer 50, a source electrode 60S and a drain electrode 60D, a protective film 71, an insulating interlayer 72, and a fixed charge control electrode 80 in that order on a substrate 11.

The substrate 11 is made of glass or a plastic. Examples of the plastic include polyethylene terephthalate (PET) and polyethylene naphthalate (PEN). Since the oxide semiconductor layer 40 is formed by sputtering (described later) without heating the substrate 11 in the present embodiment, an inexpensive plastic film may be used as the substrate 11.

The gate electrode 20 applies a gate voltage to the thin film transistor 1. The gate voltage controls the electron density in the oxide semiconductor layer 40. The gate electrode 20 is selectively provided at a thickness of, for example, 10 to 500 nm on the substrate 11, and is made of an elemental metal or alloy containing at least one metal element selected from the group consisting of platinum (Pt), titanium (Ti), ruthenium (Ru), molybdenum (Mo), copper (Cu), tungsten (W), and nickel (Ni).

The gate insulating layer 30 has a thickness of, for example, 50 nm to 1 μm, and has a single-layer or multi-layer structure including a silicon oxide layer, a silicon nitride layer, a silicon nitride oxide layer, or an aluminium oxide layer.

The oxide semiconductor layer 40 is formed in an island manner over the gate electrode 20 and its surroundings, and acts as an active layer of the thin film transistor 1. The oxide semiconductor layer 40 has a channel region 40A opposing the gate electrode 20 between the source electrode 60S and the drain electrode 60D. The buffer layer 51 and the fixed charge storage layer 50 are formed in the same shape in that order over the channel region 40A. One side of the channel region 40A is a source region connected to the source electrode 60S, and the other is a drain region connected to the drain electrode 60D.

The oxide semiconductor layer 40 is made of an oxide semiconductor. The oxide semiconductor mentioned herein refers to a compound containing oxygen and another element such as indium, gallium, zinc, or tin. Examples of the oxide semiconductor include amorphous oxide semiconductors such as indium gallium zinc oxide (IGZO), and crystalline oxide semiconductors such as zinc oxide (ZnO), indium zinc oxide (IZO, registered trademark), and indium gallium oxide (IGO). Preferably, the oxide semiconductor layer 40 has a thickness of, for example, 5 to 100 nm in view of the efficiency in supplying oxygen by annealing in the manufacturing process.

The fixed charge storage layer 50 is made of an insulating material, and is intended to store a fixed charge $Q_f$ so that the threshold voltage $V_{Th}$ of the thin film transistor 1 can be controlled. The fixed charge storage layer 50 is disposed on the channel region 40A with the buffer layer 51 (described below) therebetween. On the upper surface of the fixed charge storage layer 50, the fixed charge control electrode 80 is disposed with the protective film 71 (described below) therebetween. Consequently, the threshold voltage $V_{Th}$ of the thin film transistor 1 can be shifted to the positive side without applying a fixed charge to the gate insulating layer 30.

The fixed charge storage layer 50 can also act as a channel protective film. Preferably, such a fixed charge storage layer 50 has a single-layer or multi-layer structure including at least one layer selected from the group consisting of a silicon nitride layer, an aluminium nitride layer, and an aluminium oxide layer.

Preferably, the fixed charge storage layer 50 has a thickness (total thickness if it has a multilayer structure) of, for example, 100 nm or less. If the thickness is more than 100 nm, the voltage for storing a fixed charge $Q_f$ with the fixed charge control electrode 80 is increased.

The buffer layer 51 functions to control the discharge of the electrons stored in the fixed charge storage layer 50, and is formed of an insulating material between the fixed charge storage layer 50 and the channel region 40A. The buffer layer 51 also acts as a channel protective film together with the fixed charge storage layer 50. For example, the buffer layer 51 is preferably made of silicon oxide.

Preferably, the buffer layer 51 has a thickness of, for example, 1 to 50 nm. The charge/discharge efficiency of fixed charge $Q_f$ may be varied depending on the quality and thickness of the buffer layer 51. If the buffer layer 51 has a poor quality or a small thickness, the fixed charge $Q_f$ is easily discharged to degrade the reliability. If the thickness is too large, the voltage for storing a fixed charge $Q_f$ with the fixed charge control electrode 80 is increased to the extent that it is not suitable for operation in practice. The thickness of the buffer layer 51 is preferably in the range of 1 to 50 nm in which leakage current can be reduced to a comparatively low level.

The source electrode 60S and the drain electrode 60D are provided at both sides of the buffer layer 51 and the fixed charge storage layer 50 on the oxide semiconductor layer 40, and are electrically connected to the oxide semiconductor layer 40. The source electrode 60S and the drain electrode 60D each may include a metal layer such as that of molybdenum, aluminum, copper or titanium, or an oxygen-containing metal layer such as that of ITO (indium tin oxide) or titanium oxide, or may have a multi-layer structure including these layers. For example, the source electrode 60S and the drain electrode 60D each have a multilayer structure including a 50 nm thick molybdenum layer, a 500 nm thick aluminum layer and a 50 nm thick molybdenum layer in that order.

Preferably, the source electrode 60S and the drain electrode 60D include an oxygen-containing metal layer such as an ITO layer or a titanium oxide layer. A lattice defect occurs in the oxide semiconductor layer 40 by contact with a metal that can easily extract oxygen to separate oxygen. By forming the source electrode 60S and the drain electrode 60D of an oxygen-containing metal, the separation of oxygen from the oxide semiconductor layer 40 can be prevented, and the electrical properties of the thin film transistor 1 can be stabilized.

The protective film 71 covers the entire surfaces of the gate insulating layer 30, the fixed charge storage layer 50, and the source electrode 60S and drain electrode 60D to act as a passivation layer. For example, the protective film 71 is made of silicon oxide or silicon nitride at a thickness of 100 nm or less. Alternatively, the protective film 71 may be made of a metal oxide or metal oxide nitride, such as aluminium oxide, titanium oxide, aluminium oxide nitride, or titanium oxide nitride.

Preferably, the portion of the protective film 71 overlying the channel region 40A has a smaller thickness than the other portion. Such a structure can reduce the voltage for storing a fixed charge $Q_f$ with the fixed charge control electrode 80 while reducing the risk of a short circuit between the source electrode 60S and drain electrode 60D and the fixed charge control electrode 80.

The insulating interlayer 72 is intended for a planarizing layer for forming an organic luminescent element (organic EL element), a liquid crystal element or the like in an upper region of the thin film transistor 1, and is made of an organic material such as acrylic resin or polyimide, or an inorganic material such as silicon oxide ($SiO_2$) or silicon nitride ($Si_3N_4$). The insulating interlayer 72 has an opening 72A opposing the upper surface of the fixed charge storage layer 50.

The fixed charge control electrode 80 is disposed at the upper surface side of the fixed charge storage layer 50 with the protective film 71 therebetween, as described above. The thickness and the material of the fixed charge control electrode 80 are not particularly limited. The fixed charge control electrode 80 may be made of the same material as the electrode of an element to be connected to the thin film transistor 1. For example, if the fixed charge control electrode 80 is made of the same material as the lower electrode of an organic luminescent element, the fixed charge control electrode 80 may be a transparent electrode of ITO, indium zinc oxide (IZO, registered trademark), $SnO_2$ or the like, or a reflecting electrode made of an elemental metal or an alloy containing a metallic element such as gold (Au), platinum (Pt), nickel (Ni), chromium (Cr), copper (Cu), tungsten (W), aluminum (Al), molybdenum (Mo), or silver (Ag). If the fixed charge control electrode 80 is made of the same material as the upper electrode of an organic luminescent element, the fixed charge control electrode 80 may be made of an elemental metal or an alloy containing a metallic element such as aluminum (Al), magnesium (Mg), calcium (Ca), or sodium (Na). Among those, preferred are an alloy (MgAg alloy) of magnesium and silver and an alloy (AlLi alloy) of aluminum (Al) and lithium.

The fixed charge control electrode 80 is preferably disposed on an inner surface (side surface and bottom surface) of the opening 72A of the insulating interlayer 72. Such a structure can reduce the voltage for storing a fixed charge $Q_f$ with the fixed charge control electrode 80.

The thin film transistor 1 can be formed by the following method.

Figure 2A:
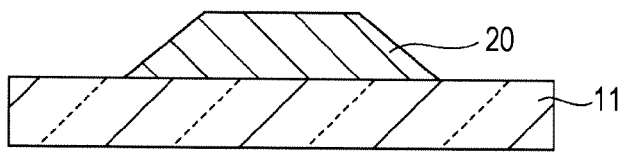
FIGS. 2A to 2D are sectional views illustrating in step order a method for manufacturing the thin film transistor shown in FIG. 1.

FIGS. 2A to 4B show a method for manufacturing the thin film transistor 1 in order of steps. First, a metal film that is a material layer of the gate electrode 20 is formed over the entire surface of the substrate 11 by, for example, sputtering or vapor deposition. The metal film is patterned into the gate electrode 20 by, for example, photolithography, as shown in FIG. 2A.

Figure 2B:
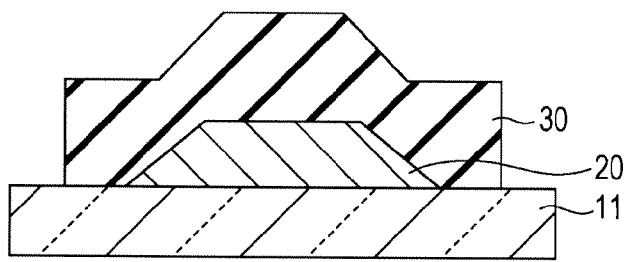

Subsequently, the gate insulating layer 30 is formed on the surface of the gate electrode 20, as shown in FIG. 2B. For example, a silicon nitride film is formed by plasma CVD using a material gas such as silane, ammonia, or nitrogen, and then a silicon oxide film is formed by plasma CVD using a material gas such as silane or nitrogen monoxide.

Figure 2C:
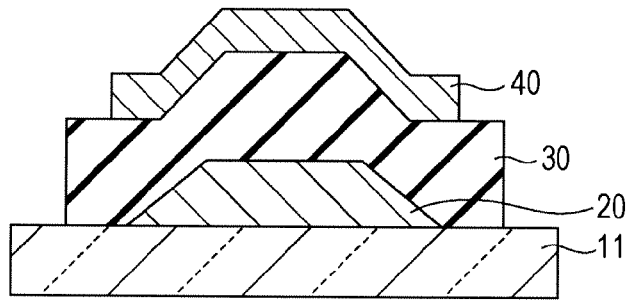

Then, the oxide semiconductor layer 40 is formed on the gate insulating layer 30 by, for example, sputtering and patterned into a predetermined shape, as shown in FIG. 2C.

If an IGZO (indium gallium zinc oxide) oxide semiconductor layer 40 is formed on the gate insulating layer 30, it is formed by DC sputtering using a ceramic target of indium gallium zinc oxide with plasma discharge of a mixed gas containing argon and oxygen. Before the plasma discharge, a vacuum vessel is evacuated to a vacuum of $1 \times 10^{-4}$ Pa or less, and then the mixed gas of argon and oxygen is introduced.

If an oxide semiconductor layer 40 of zinc oxide is formed, it may be formed by RF sputtering using a ceramic target of zinc oxide, or by sputtering with a DC power source using a metal target of zinc in an atmosphere of a gas containing argon and oxygen.

In this instance, the carrier concentration in the oxide semiconductor layer 40, which is to act as a channel, can be controlled by varying the proportion of the flow rates of argon and oxygen for forming the oxide.

Figure 2D:
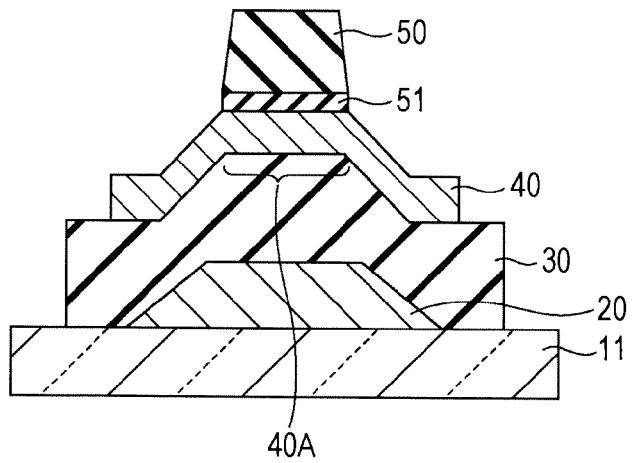

After the formation of the oxide semiconductor layer 40, a silicon oxide film that is a material layer of the buffer layer 51, and a silicon nitride, aluminium nitride or aluminium oxide film that is a material layer of the fixed charge storage layer 50 are formed in that order on the oxide semiconductor layer 40 by, for example, CVD or sputtering, followed by patterning. Thus the buffer layer 51 and the fixed charge storage layer 50 are formed of the above-described materials at the above-described thicknesses over the channel region 40A, as shown in FIG. 2D.

Figure 3A:
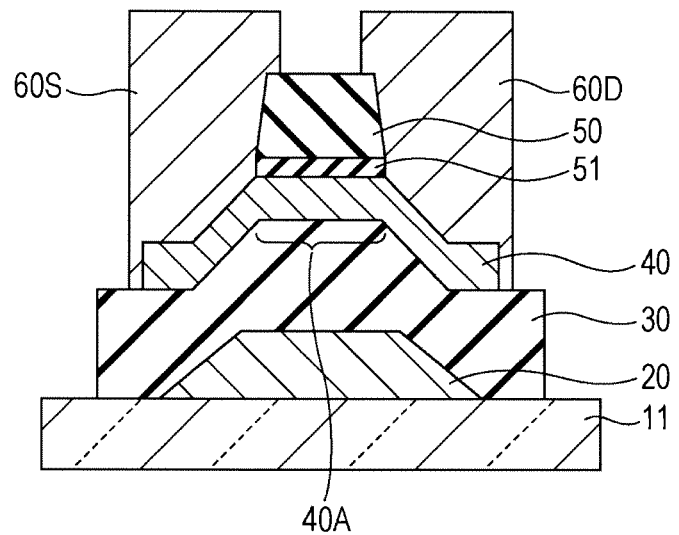
FIGS. 3A and 3B are sectional views of steps following the step shown in FIG. 2D.

Subsequently, a 50 nm thick molybdenum layer, a 500 nm thick aluminum layer and a 50 nm thick molybdenum layer are formed in that order to form a three-layer structure by, for example, sputtering. Then, the three-layer structure is patterned into the source electrode 60S and drain electrode 60D by wet etching with a mixed solution containing phosphoric acid, nitric acid and acetic acid, as shown in FIG. 3A.

Figure 3B:
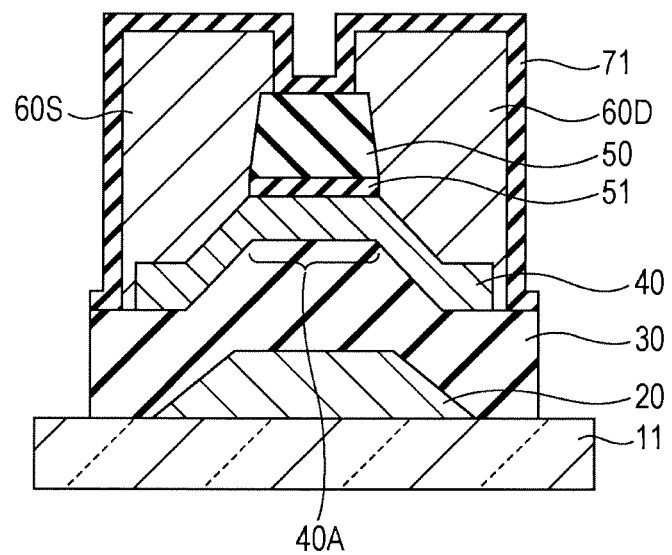

Subsequently, the protective film 71 is formed of the above-described material to the above-described thickness, followed by patterning, as shown in FIG. 3B. For patterning the protective film 71, preferably, etching is performed through a mask (not shown) having an opening in a portion overlying the channel region 40A so that the protective film 71 has a thinner portion over the channel region 40A. Such a structure can reduce the voltage for storing a charge to the fixed charge storage layer 50 with the fixed charge control electrode 80, while reducing the risk of a short circuit between the source electrode 60S and drain electrode 60D and the fixed charge control electrode 80.

Figure 4A:
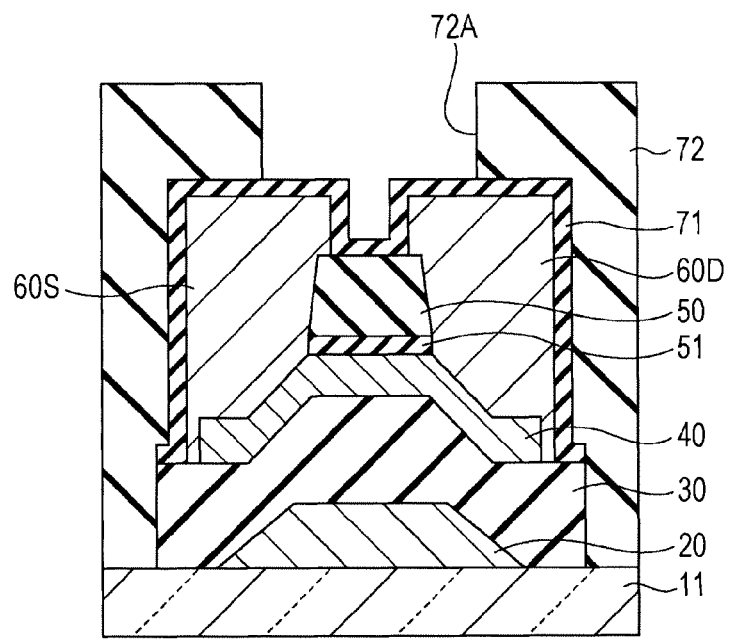
FIGS. 4A and 4B are sectional views of steps following the step shown in FIG. 3B.

After the formation of the protective film 71, for example, an organic material is applied and subsequently exposed and fired, thus forming the insulating interlayer 72, as shown in FIG. 4A. For the exposure and firing, an opening 72A is formed in the insulating interlayer 72 in the portion opposing the upper surface of the fixed charge storage layer 50.

Figure 4B:
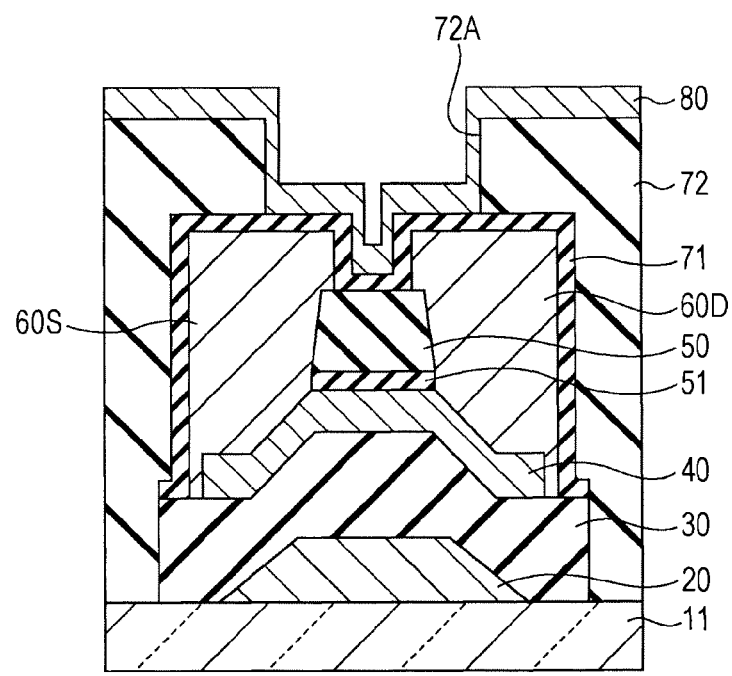

Then, the fixed charge control electrode 80 is formed of the above-described material over the upper surface of the insulating interlayer 72 and the inner surface of the opening 72A, as shown in FIG. 4B. Through the above steps, the thin film transistor 1 shown in FIG. 1 is completed.

In the thin film transistor 1, if a predetermined voltage (gate voltage) equal to or more than the threshold voltage is applied to the gate electrode 20 through a wiring layer (not shown), a current (drain current) occurs in the channel region 40A of the oxide semiconductor layer 40 between the source electrode 60S and the drain electrode 60D.

In this instance, the fixed charge storage layer 50 made of an insulating material is provided over the channel region 40A, and the fixed charge control electrode 80 is provided at the upper surface side of the fixed charge storage layer 50. Consequently, when the fixed charge control electrode 80 and the drain electrode 60D are set at a positive (+) potential and a negative (−) potential respectively so that the source electrode 60S electrically floats, or when only the fixed charge control electrode 80 is set at a positive (+) potential, hot electrons accelerated by a channel electric field or hot electrons produced by impact ionization are injected from the channel region 40A near the drain electrode 60D to the fixed charge storage layer 50 and stored there. Thus, the potential of the channel region 40A is controlled, so that the threshold voltage $V_{Th}$ is shifted to the positive side.

Also, since the silicon oxide buffer layer 51 is provided between the channel region 40A and the fixed charge storage layer 50, the buffer layer 51 suppresses the discharge of the fixed charge $Q_f$ stored in the fixed charge storage layer 50 to enhance the reliability.

Figure 5:
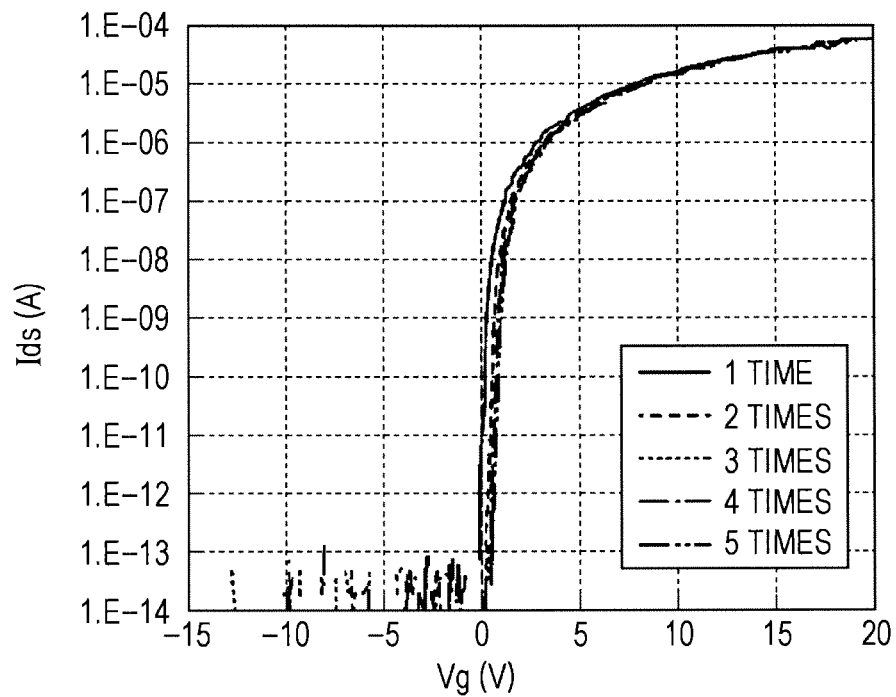
FIG. 5 is a plot of the Vg-Id characteristics of a thin film transistor continuously measured without applying a voltage between the fixed charge control electrode and the drain electrode.
Figure 6:
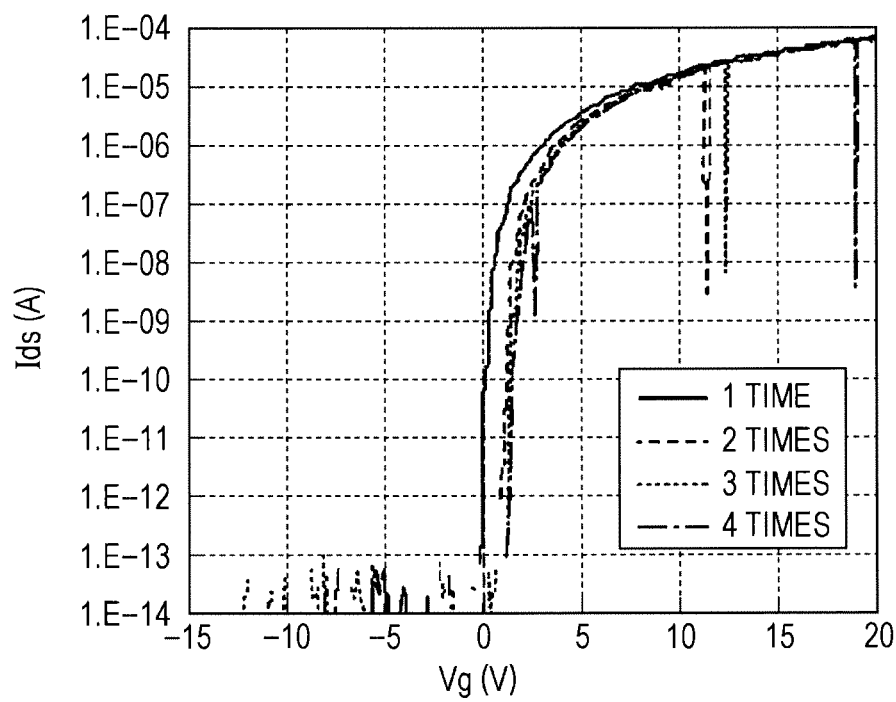
FIG. 6 is a plot of the Vg-Id characteristics of the thin film transistor measured every time a voltage of 20 V was applied for about 10 seconds between the fixed charge control electrode and the drain electrode.
Figure 7:
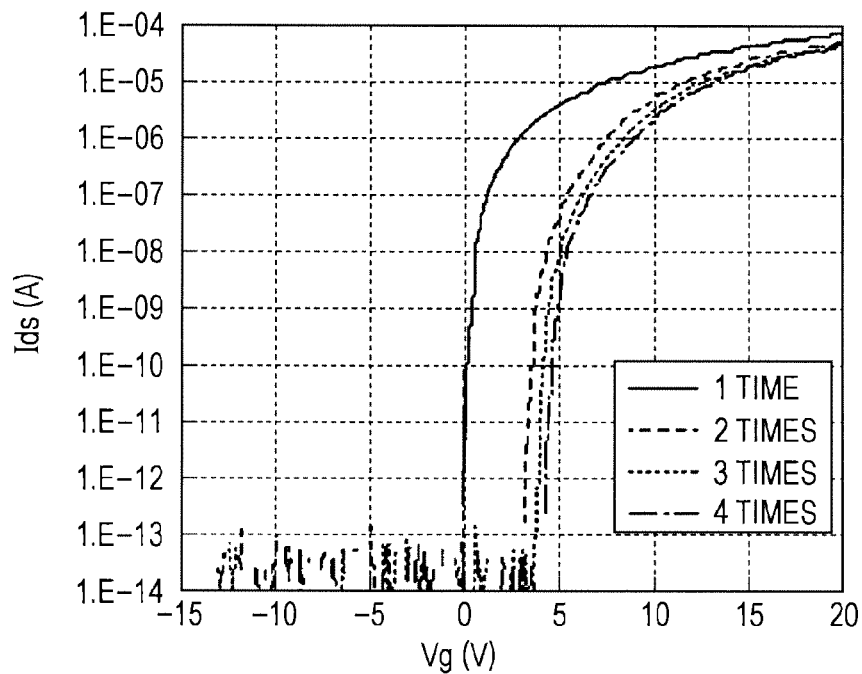
FIG. 7 is a plot of the Vg-Id characteristics of the thin film transistor measured every time a voltage of 30 V was applied for about 10 seconds between the fixed charge control electrode and the drain electrode.

FIGS. 5 to 7 are the results of measurements for the variation of the transmission characteristics of the thin film transistor 1 when a charge is stored in the fixed charge storage layer 50 with the fixed charge control electrode 80. FIG. 5 shows the results of continuous measurement of Vg-Id characteristics with no voltage applied between the fixed charge control electrode 80 and the drain electrode 60D. The threshold voltage $V_{Th}$ was hardly varied.

FIG. 6 shows the results of Vg-Id characteristics measured when a voltage of 20 V applied between the fixed charge control electrode 80 and the drain electrode 60D for about 10 seconds. The voltage was applied three times, and the Vg-Id characteristics were measured every time the voltage had been applied for 10 seconds. FIG. 6 shows that the threshold voltage was shifted by about 1 V by injecting a fixed charge once.

FIG. 7 shows the results of Vg-Id characteristics measured when a voltage of 30 V applied between the fixed charge control electrode 80 and the drain electrode 60D for about 10 seconds. The voltage was applied five times, and the Vg-Id characteristics were measured every time the voltage had been applied. FIG. 7 shows that the threshold voltage was shifted by about 3.5 V by injecting a fixed charge once.

Figure 8:
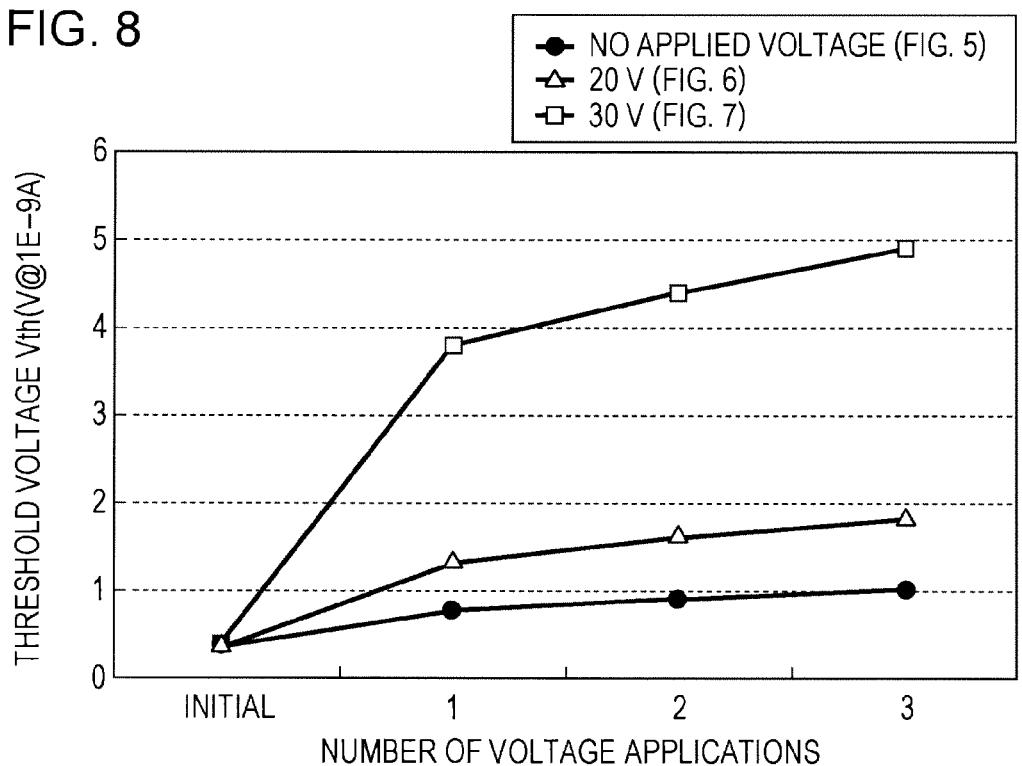
FIG. 8 is a plot showing the results of FIGS. 5 to 7 together.

FIG. 8 shows the results of FIGS. 5 to 7 together. As is clear from FIG. 8, the threshold voltage $V_{Th}$ can be shifted by about 1 V to the positive side by applying a voltage of 20 V between the fixed charge control electrode 80 and the drain electrode 60D. Further, by increasing the voltage applied between the fixed charge control electrode 80 and the drain electrode 60D to 30 V so as to increase the injection of the fixed charge, the threshold voltage $V_{Th}$ can be shifted up to about 4.5 V to the positive side.

If the thin film transistor 1 is used as an active driving element of an organic luminescent element, it is preferable that the voltage applied between the fixed charge control electrode 80 and the drain electrode 60D be set at 20 V, in view of the results shown in FIG. 8 and the anode potential of the organic luminescent element.

In the thin film transistor 1 of the present embodiment, since the fixed charge storage layer 50 made of an insulating material is provided over the channel region 40A, and the fixed charge control electrode 80 is provided at the upper surface side of the fixed charge storage layer 50, the threshold voltage $V_{Th}$ can be shifted to the positive side without injecting a fixed charge $Q_f$ to the gate insulating layer 30. Consequently, the thin film transistor 1 can stably be of enhancement type. Accordingly, peripheral circuits of a display device can be constituted of only oxide semiconductor thin film transistors 1, so that the cost of the display device can be reduced.

Since it is not necessary to inject a fixed charge $Q_f$ to the gate insulating layer 30, the gate insulating film 30 is not degraded by the injection of fixed charge $Q_f$. Furthermore, the fixed charge $Q_f$ is not discharged by repeating on/off operation of the TFT with the gate insulating layer 30 storing a fixed charge $Q_f$, and accordingly, the reliability can be enhanced. Also, it can be avoided that the manufacturing process is complicated by the step of ejecting a fixed charge $Q_f$ to the gate insulating layer 30.

Figure 9:
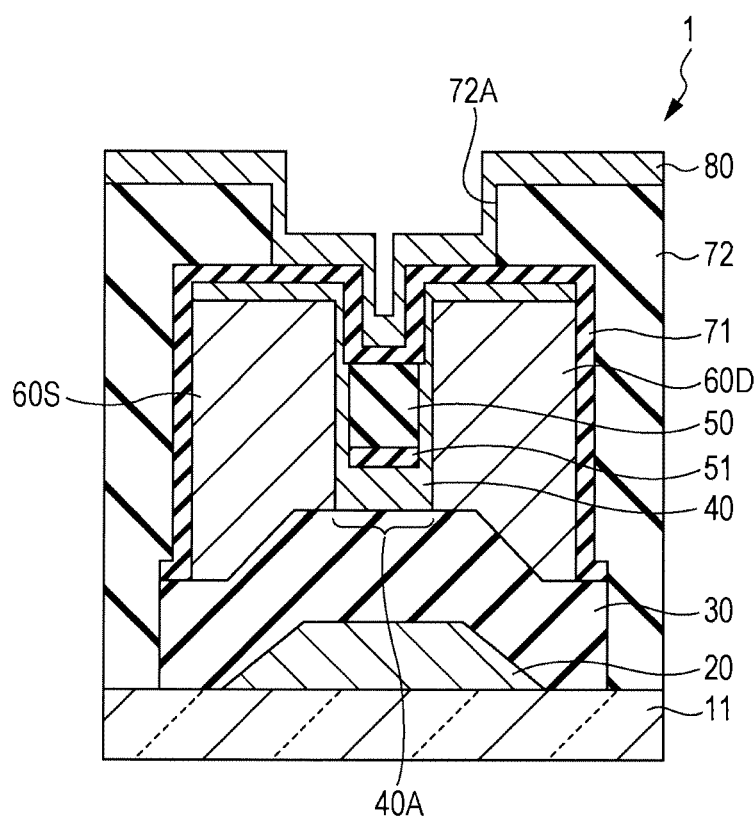
FIG. 9 is a sectional view of a thin film transistor according to a modification of an embodiment.

Although the above-described embodiment illustrates the structure in which the entire oxide semiconductor layer 40 is disposed on the gate insulating layer 30, only the channel region 40A of the oxide semiconductor layer 40 is disposed on the gate insulating layer 30, as shown in FIG. 9. In this instance, the thin film transistor has a bottom contact structure in which the source electrode 60S and the drain electrode 60D are in contact with the bottom of the oxide semiconductor layer 40.

Application 1

Figure 10:
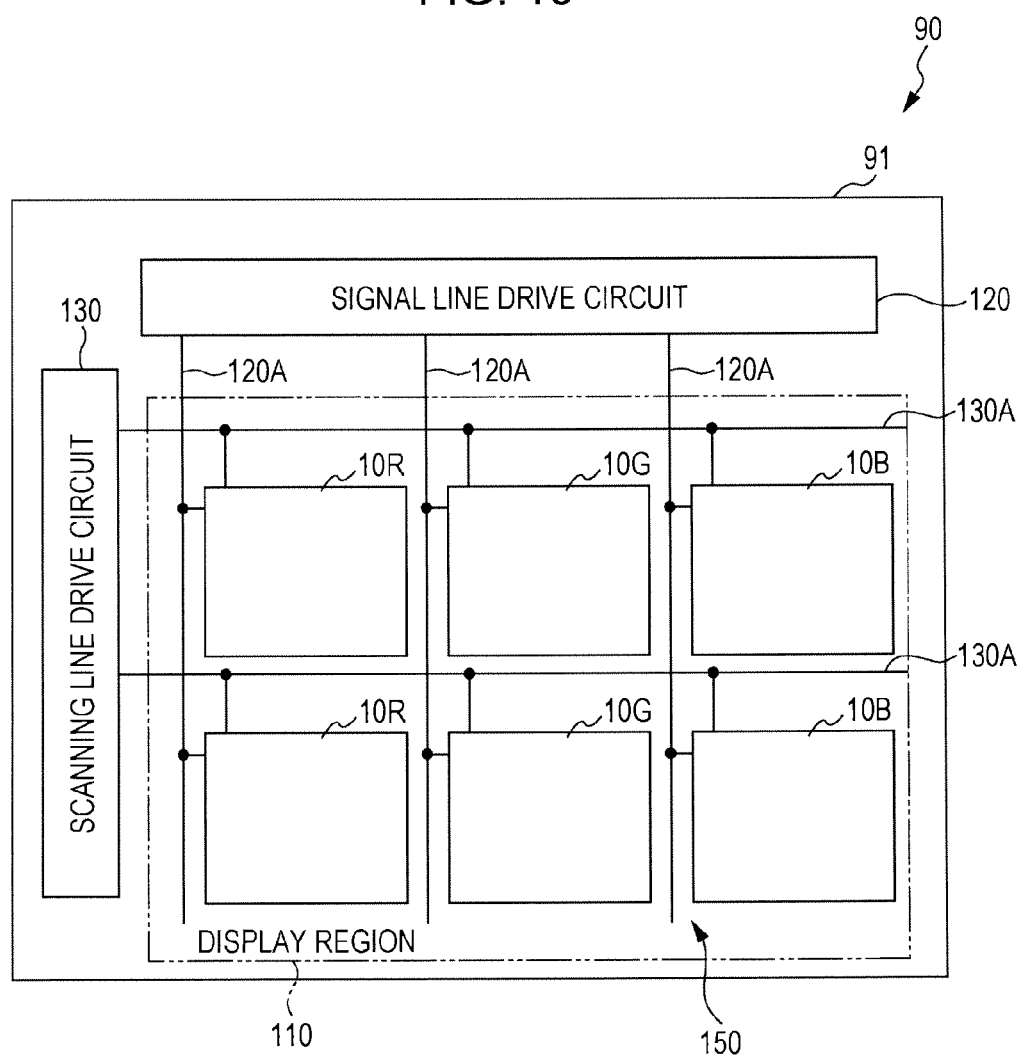
FIG. 10 is a block diagram of a circuit configuration of a display device according to Application 1.

FIG. 10 shows a circuit structure of a display device including the thin film transistors 1 as driving elements. The display device 90, which may be a liquid crystal display or an organic EL display, includes a plurality of pixels 10R, 10G and 10B arranged in a matrix manner on a drive panel 91, and drive circuits driving these pixels 10R, 10G and 10B. The pixels 10R, 10G and 10B are, for example, liquid crystal display elements or organic EL elements emitting red (R), green (G) and blue (B) lights, respectively. These three pixels 10R, 10G and 10B constitute a set of pixels, and a plurality of sets of the pixels define a display region 110. The drive circuits disposed on the drive panel 91 include a signal line drive circuit 120 and a scanning line drive circuit 130 that act as drivers for displaying images, and a pixel drive circuit 150. The drive panel 91 is bonded with a sealing panel (not shown) together, and the sealing panel seals the pixels 10R, 10G and 10B and the drive circuits.

Figure 11:
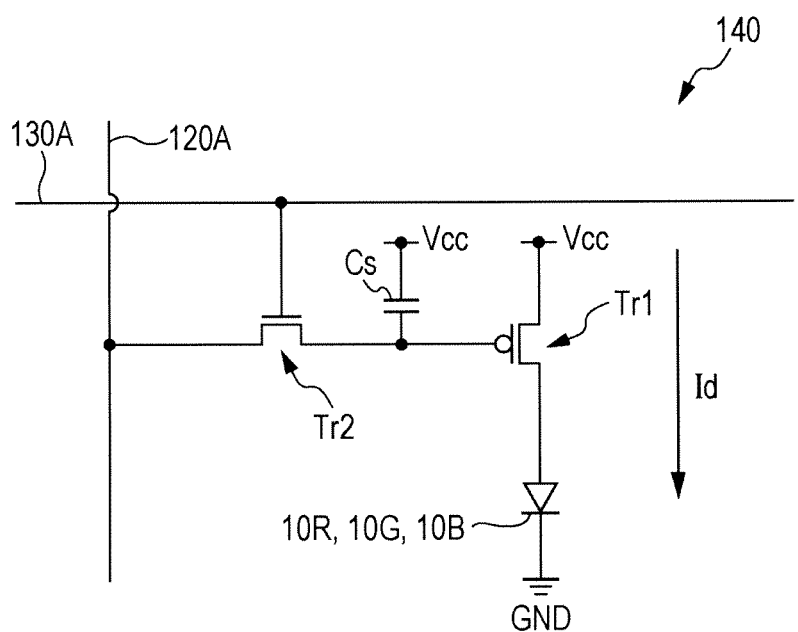
FIG. 11 is an equivalent circuit diagram of a pixel drive circuit shown in FIG. 10.

FIG. 11 is an equivalent circuit diagram of the pixel drive circuit 150. The pixel drive circuit 150 is of an active type including the thin film transistors 1 as transistor Tr1 and Tr2. A capacitor Cs is disposed between the transistors Tr1 and Tr2, and any one of the pixels 10R, 10G and 10B is connected to the transistor Tr1 in series between a first power source line (Vcc) and a second power source line (GND). In this pixel drive circuit 150, a plurality of signal lines 120A are arranged so as to extend in the column direction, and a plurality of scanning lines 130A are arranged so as to extend in the row direction. Each signal line 120A is connected to a signal line drive circuit 120, so that an image signal is transmitted to the source electrode of the transistor Tr2 from the signal line drive circuit 120 through the signal line 120A. Each scanning line 130A is connected to the scanning line drive circuit 130, so that a scanning signal is transmitted to the gate electrodes of the transistors Tr2 one after another from the scanning line drive circuit 130 through the scanning line 130A.

Figure 12:
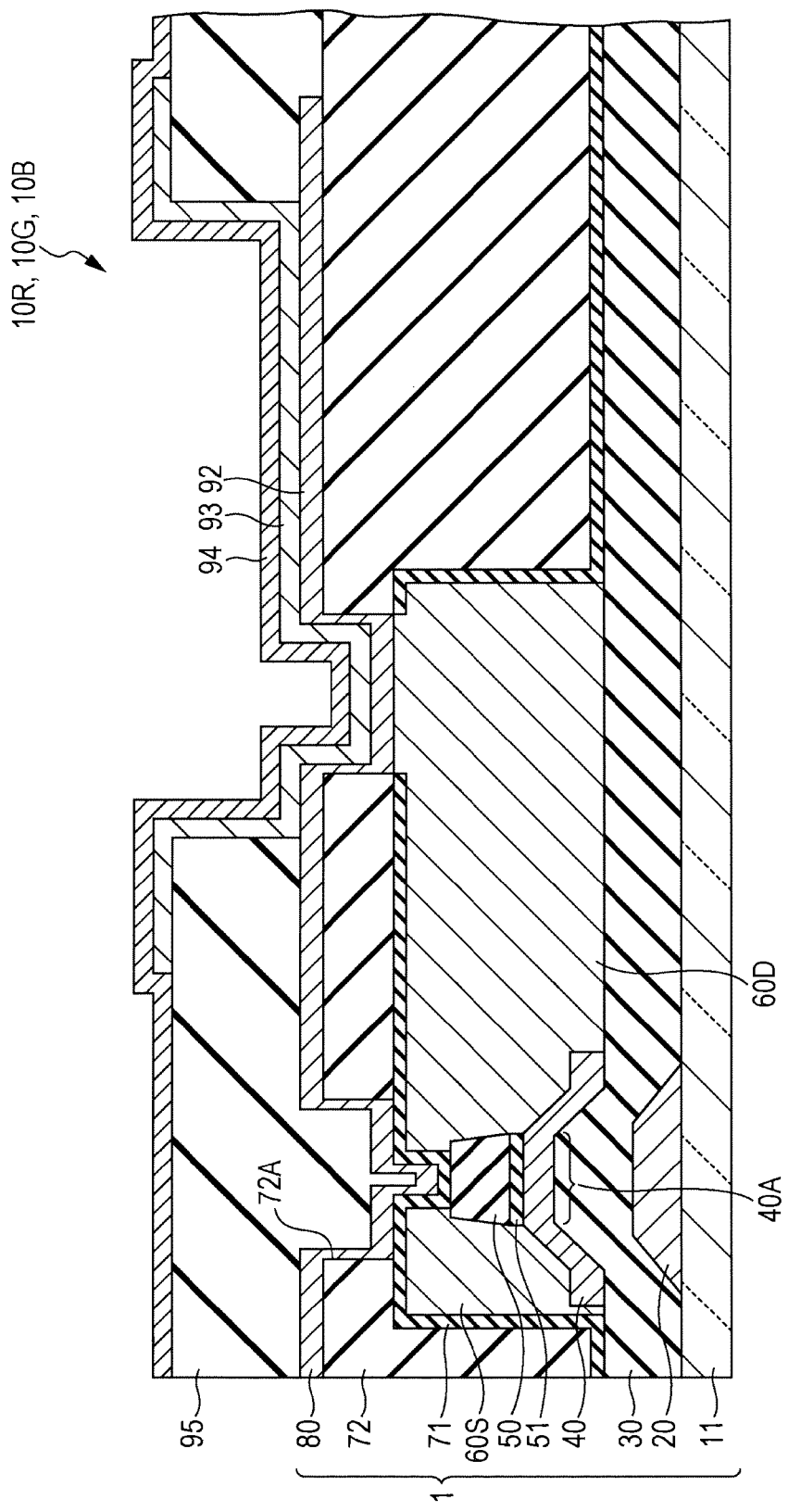
FIG. 12 is a fragmentary sectional view of a structure including the pixel and the thin film transistors shown in FIG. 11.

FIG. 12 shows a structure including the pixel 10R (or 10G or 10B) and the thin film transistor 1 shown in FIG. 11. For example, the pixel 10R (or pixel 10G or 10B) is an organic luminescent element including on the insulating interlayer 72 a lower electrode 92 acting as an anode, an organic layer 93 including a luminescent layer (not shown), and an upper electrode 94 acting as a cathode, in that order from the substrate 11 side. The pixels 10R, 10G and 10B are separated from one another by an insulating pixel separation film 95. The fixed charge control electrode 80 of the thin film transistor 1 continues to the lower electrode 92; hence, it is made of the same material as the lower electrode 92.

The lower electrode 92 is provided for each of the pixels 10R, 10G and 10B. If light from the luminescent layer is emitted through the lower electrode 92 (bottom emission type), the lower electrode 92 is made of a transparent material, such as ITO, indium zinc oxide (IZO, registered trademark), or $SnO_2$. If light from the luminescent layer is emitted through the upper electrode 94 (top emission type), the lower electrode 92 is made of an elemental metal or an alloy of a metallic element, such as gold (Au), platinum (Pt), nickel (Ni), chromium (Cr), copper (Cu), tungsten (W), aluminum (Al), molybdenum (Mo), or silver (Ag). The lower electrode 92 may be a composite film including a transparent electrode and a reflective electrode.

The organic layer 93 has a multilayer structure including, for example, a hole injection layer, a hole transport layer, a luminescent layer, an electron transport layer, and an electron injection layer, in that order from the lower electrode 92 side. These layers other than the luminescent layer may be provided if necessary. The organic layers 93 may have different structures depending on the color of light emitted from the respective pixels 10R, 10G and 10B. The hole injection layer is intended to enhance the hole injection efficiency and, in addition, to act as a buffer layer preventing leakage. The hole transport layer enhances the efficiency of hole transport to the luminescent layer. The luminescent layer emits light by recombination of electrons and holes caused by applying an electric field to the luminescent layer. The electron transport layer enhances the efficiency of electron transport to the luminescent layer. The electron injection layer has a thickness of, for example, about 0.3 nm and is made of LiF, $Li_2O$ or the like.

For example, the hole injection layer of the pixel 10R emitting red light contains 4,4',4''-tris(3-methylphenylphenylamino)triphenylamine (m-MTDATA) or 4,4',4''-tris(2-naphthylphenylamino)triphenylamine (2-TNATA). The hole transport layer of the pixel 10R may contain bis[(N-naphthyl)-N-phenyl]benzidine (α-NPD). The luminescent layer of the pixel 10R may contain a mixture of 9,10-di-(2-naphthyl)anthracene (ADN) and 30% by weight of 2,6-bis[4'-methoxydiphenylamine)styryl]-1,5-dicyanonaphthalene (BSN). The electron transport layer of the pixel 10R may contain 8-hydroxyquinoline aluminum ($Alq_3$).

For example, the hole injection layer of the pixel 10G emitting green light may contain m-MTDATA or 2-TNATA. The hole transport layer of the pixel 10G may contain a-NPD. The luminescent layer of the pixel 10G may contain a mixture of AND and 5% by volume of coumarin 6. The electron transport layer of the pixel 10G may contain $Alq_3$.

For example, the hole injection layer of the pixel 10B emitting blue light may contain m-MTDATA or 2-TNATA. The hole transport layer of the pixel 10B may contain α-NPD. The luminescent layer of the pixel 10B may contain a mixture of AND and 2.5% by weight of 4,4'-bis[2-{4-(N,N-diphenylamino)phenyl}vinyl]biphenyl (DPAVBi). The electron transport layer of the pixel 10B may contain $Alq_3$.

The upper electrode 94 acts as a common electrode of the pixels 10R, 10G and 10B, and is, for example, made of a elemental metal or an alloy of a metallic element such as aluminum (Al), magnesium (Mg), calcium (Ca), or sodium (Na) at a thickness of 5 to 50 nm. Among those materials, preferred are an alloy (MgAg alloy) of magnesium and silver and an alloy (AlLi alloy) of aluminum and lithium. The upper electrode 94 may be a composite film including an elemental metal or alloy layer and a transparent electrode like the lower electrode 92.

The insulating pixel separation film 95 is intended to ensure the insulation between the lower electrodes 92 and the upper electrode 94, and to define light-emitting regions having a precise desired shape. The insulating pixel separation film 95 may be made of silicon oxide or a photosensitive resin, such as polyimide, at a thickness of about 1 μm. The insulating pixel separation film 95 has openings corresponding to the light-emitting regions. Although the organic layer 93 and the upper electrode 94 extend to the upper surface of the insulating pixel separation film 95, only the portion in the opening of the insulating pixel separation film 95 emits light.

Figure 13:
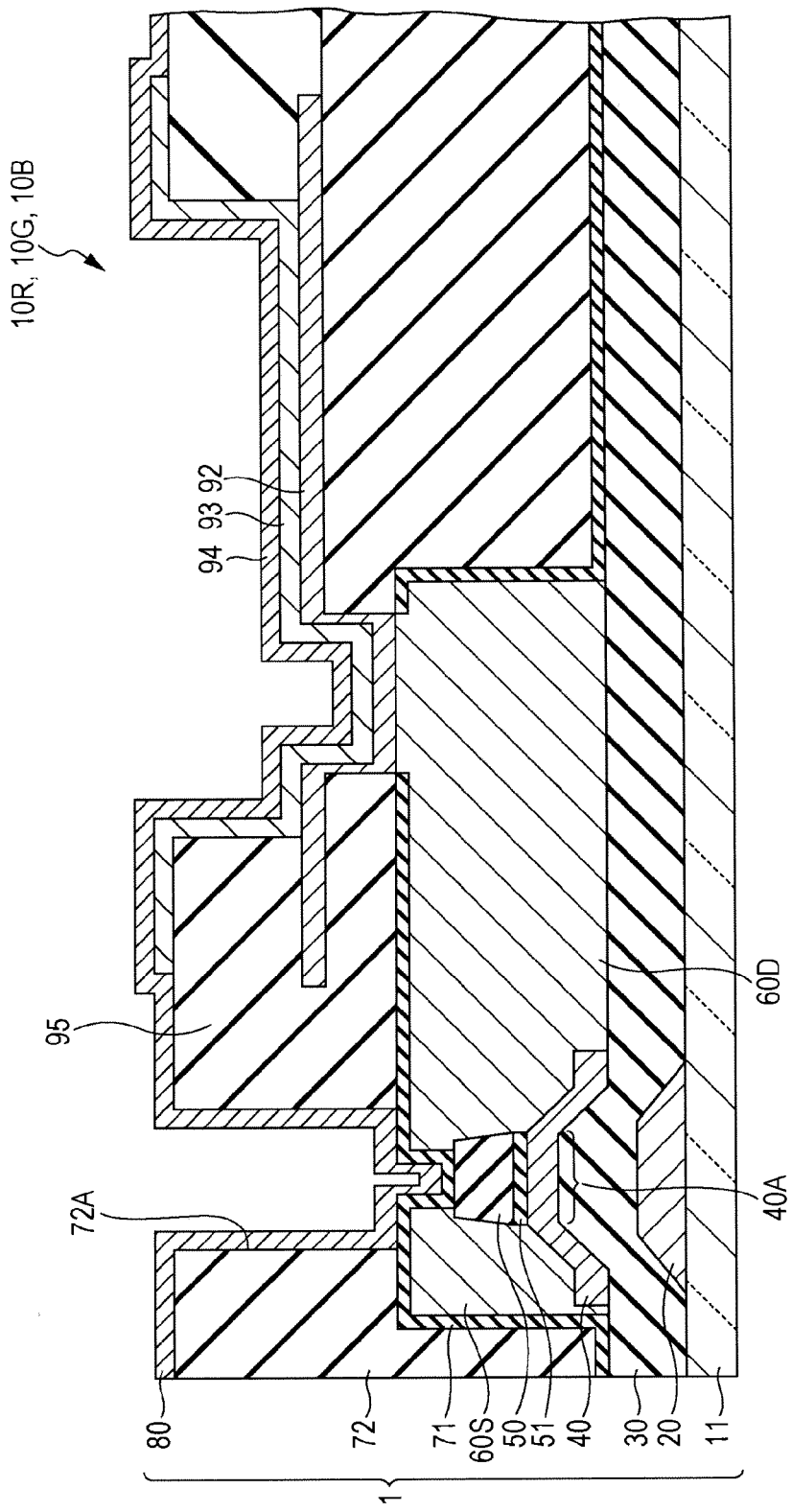
FIG. 13 is a fragmentary sectional view another structure including the pixel and thin film transistors shown in FIG. 11.

FIG. 13 shows another structure including the pixel 10R (or 10G or 10B) and the thin film transistor 1. In this structure, the fixed charge control electrode 80 of the thin film transistor 1 continues to the upper electrode 94; hence, it is made of the same material as the upper electrode 94.

In order to prevent the voltage drop of the upper electrode 94, auxiliary wirings (not shown) may be provided along the boundaries between the pixels 10R, 10G and 10B on the insulating pixel separation film 95 between the pixels 10R, 10G and 10B, and the upper electrode 94 is connected to the auxiliary wirings. In this instance, the fixed charge control electrode 80 of the thin film transistor 1 may be provided so as to continue to the auxiliary wirings and made of the same material as the auxiliary wirings.

A display device 90 having such a structure can be used in electronic apparatuses described in the following Applications 2 to 6.

Application 2

Figure 14:
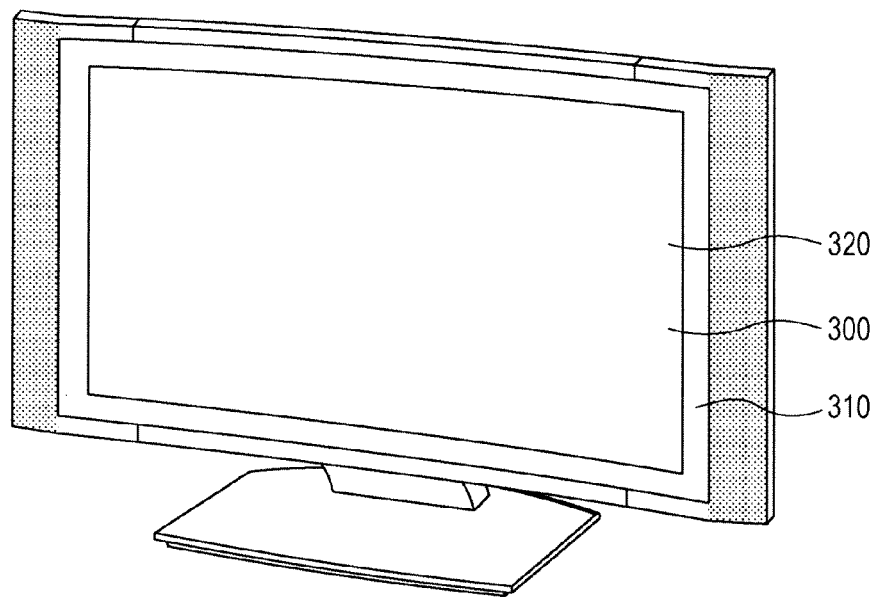
FIG. 14 is a perspective view of the exterior of a television apparatus according to Application 2.

FIG. 14 is an external view of a television apparatus. For example, the television apparatus includes a front panel 310 and an image display portion 300 including a filter glass 320.

Application 3

Figure 15A:
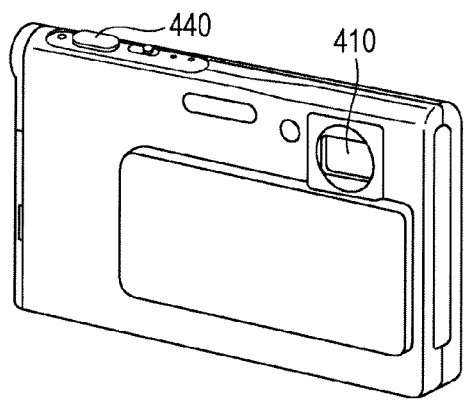
FIG. 15A is a perspective view of the exterior viewed from the front side of a digital still camera according to Application 3.
Figure 15B:
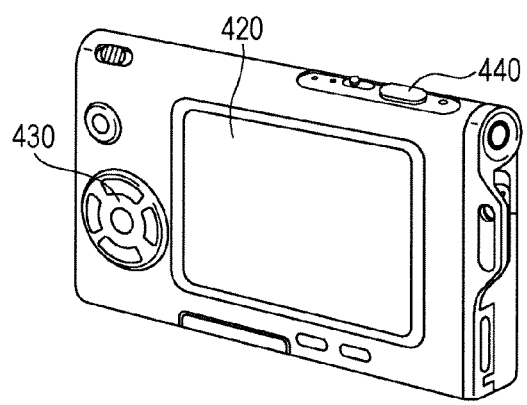
FIG. 15B is a perspective view of the exterior viewed from the rear side of the digital still camera.

FIGS. 15A and 15B are external views of a digital still camera. For example, the digital still camera includes a light-emitting portion 410 for a flashlight, a display portion 420, a menu switch 430, and a shatter release 440.

Application 4

Figure 16:
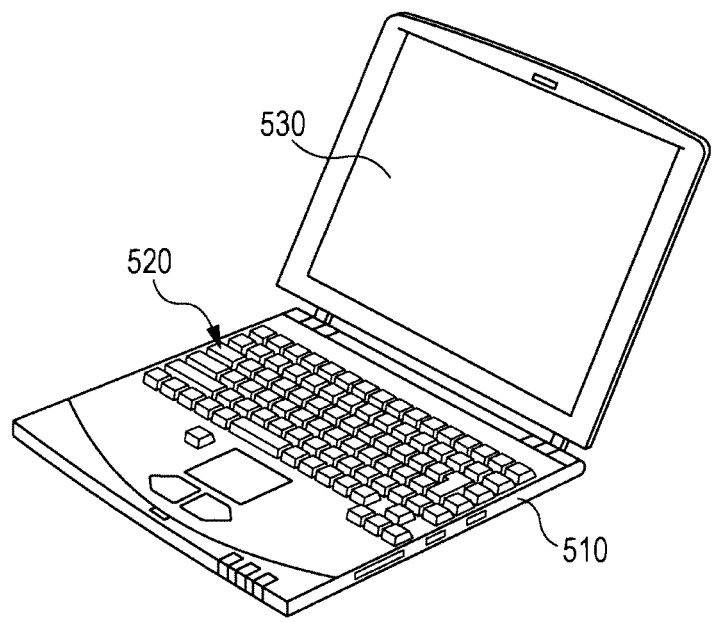
FIG. 16 is a perspective view of the exterior of a notebook personal computer according to Application 4.

FIG. 16 is an external view of a notebook personal computer. For example, the notebook personal computer includes a body 510, a keyboard 520 with which characters or the like can be input, and a display portion 530 on which images are displayed.

Application 5

Figure 17:
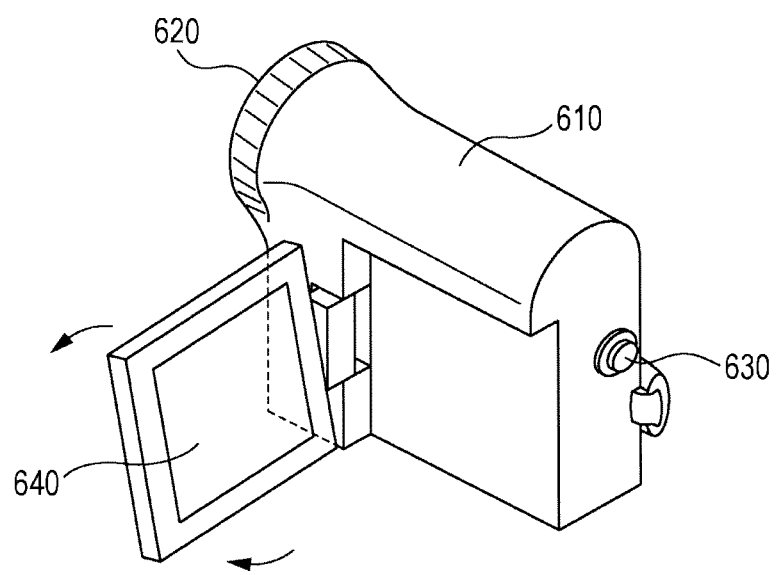
FIG. 17 is a perspective view of the exterior of a video camera according to Application 5.

FIG. 17 is an external view of a video camera. For example, the video camera includes a body 610, object shooting lens 620 disposed on the forward side of the body 610, a shooting start/stop switch 630, and a display portion 640.

Application 6

FIGS. 18A to 18G are external views of a cellular phone. For example, the cellular phone has an upper enclosure 710 and a lower enclosure 720 that are coupled with a joint (hinge) 730, and includes a display 740, a sub display 750, a picture light 760, and a camera 770.

Various modifications may be made to the exemplary embodiments. For example, the material and thickness of each layer and the method and conditions for forming the layer are not limited to those disclosed on the above embodiments. The layers may be formed of other materials to other thicknesses by other methods under different conditions.

The embodiments may be applied to other display devices using other display elements, such as inorganic electroluminescence elements and electrodeposition or electrochromic display elements, in addition to liquid crystal display devices and organic EL display devices.

It should be understood that various changes and modifications to the presently preferred embodiments described herein will be apparent to those skilled in the art. Such changes and modifications can be made without departing from the spirit and scope and without diminishing its intended advantages. It is therefore intended that such changes and modifications be covered by the appended claims.

The application is claimed as follows:

1. A thin film transistor comprising:
a gate electrode, a source electrode, and a drain electrode;
an oxide semiconductor active layer formed over the gate electrode;
a fixed charge storage layer formed over a portion of the oxide semiconductor active layer; and
a fixed charge control electrode formed over the fixed charged storage layer.

2. The thin film transistor according to claim 1, further comprising a buffer layer formed between the oxide semiconductor active layer and the fixed charge storage layer.

3. The thin film transistor according to claim 2, wherein the buffer layer is made of an insulating material and is positioned between the fixed charge storage layer and a channel region of the oxide semiconductor active layer.

4. The thin film transistor according to claim 2, wherein the buffer layer is made of silicon oxide, and the fixed charge storage layer includes at least one film selected from the group consisting of a silicon nitride film, an aluminum nitride film and an aluminum oxide film.

5. The thin film transistor according to claim 4, further comprising an insulating interlayer on the source electrode and the drain electrode, the insulating interlayer having an opening opposing the upper surface of the fixed charge storage layer in such a manner that the fixed charge control electrode is disposed on an inner surface of the opening.

6. The thin film transistor according to claim 5, wherein the buffer layer has a thickness in the range of 1 to 50 nm.

7. The thin film transistor according to claim 6, wherein the fixed charge storage layer has a thickness of 100 nm or less.

8. The thin film transistor according to claim 2, wherein the source electrode and the drain electrode are provided on portions of the oxide semiconductor active layer, and also contact both sides of the buffer layer and the fixed charge storage layer.

9. The thin film transistor according to claim 2, wherein the buffer layer is formed of an insulating material and is configured to control a discharge of electrons stored in the fixed charge storage layer.

10. The thin film transistor according to claim 1, further comprising a protective film formed on surfaces of a gate insulating layer, the source electrode, and the drain electrode,
wherein the protective film is formed between the fixed charge storage layer and the fixed charge control electrode, and
wherein the gate insulating layer is formed between the gate electrode and the oxide semiconductor active layer.

11. The thin film transistor according to claim 10, further comprising an insulating interlayer surrounding portions of the gate insulating layer and the protective film.

12. The thin film transistor according to claim 11, wherein the insulating interlayer has an insulating interlayer opening opposing an upper surface of the fixed charge storage layer.

13. The thin film transistor according to claim 12, wherein the fixed charge control electrode is disposed at least on a bottom surface and side surfaces of the insulating interlayer opening.

14. The thin film transistor according to claim 1, wherein the oxide semiconductor active layer includes a channel region, and the buffer layer and the fixed charge layer are formed of shapes at least substantially corresponding to a shape of the channel region.

15. The thin film transistor according to claim 14, wherein a portion of the protective film overlying the channel region has a thickness smaller than other portions of the protective film.

16. The thin film transistor according to claim 1, wherein the source electrode and the drain electrode are provided on portions of the oxide semiconductor active layer.

17. A display device comprising:
a substrate;
a thin film transistor formed on the substrate, the thin film transistor including a gate electrode, a gate insulating layer disposed on the surface of the gate electrode, an oxide semiconductor layer including a channel region on the gate insulating layer, a fixed charge storage layer having an upper surface, made of an insulating material over the channel region, a source electrode and a drain electrode that are each electrically connected to the oxide semiconductor layer, and a fixed charge control electrode disposed at the upper surface side of the fixed charge storage layer; and
a pixel formed on the substrate.

18. The display device according to claim 17, wherein the pixel is an organic luminescent element including a lower electrode, an organic layer including a luminescent layer, and an upper electrode, in that order from the substrate side, and the fixed charge storage layer is made of the same material as the lower electrode or the upper electrode.

\* \* \* \* \*